(12) United States Patent
Kouyama et al.

(10) Patent No.: US 6,878,249 B2
(45) Date of Patent: Apr. 12, 2005

(54) HIGH FREQUENCY SPUTTERING DEVICE

(75) Inventors: Yuka Kouyama, Tokyo (JP); Shinya Hasegawa, Tokyo (JP); Yoichi Numazawa, Tokyo (JP)

(73) Assignee: Anelva Corporation, Fuchi (JP)

( * ) Notice: Subject to any disclaimer, the term of this patent is extended or adjusted under 35 U.S.C. 154(b) by 117 days.

(21) Appl. No.: 09/867,383

(22) Filed: May 31, 2001

(65) Prior Publication Data

US 2001/0052458 A1 Dec. 20, 2001

(30) Foreign Application Priority Data

Jun. 16, 2000 (JP) .................................. 2000-180933

(51) Int. Cl.⁷ .............................................. C23C 14/34
(52) U.S. Cl. ........................ 204/298.11; 204/298.06
(58) Field of Search .................. 204/298.06, 298.11, 204/298.12

(56) References Cited

U.S. PATENT DOCUMENTS

| | | | | |
|---|---|---|---|---|
| 4,401,546 A | * | 8/1983 | Nakamura et al. | 204/298.12 |
| 4,622,122 A | * | 11/1986 | Landau | 204/298.19 |
| 4,897,172 A | | 1/1990 | Katsura et al. | |
| 5,167,789 A | * | 12/1992 | Latz | 204/298.11 |

FOREIGN PATENT DOCUMENTS

| | | | | | |
|---|---|---|---|---|---|
| JP | 53008377 A | * | 1/1978 | ........... | C23C/15/00 |
| JP | 57194254 A | * | 11/1982 | ........... | C23C/15/00 |
| JP | 62-108527 | | 5/1987 | | |
| JP | 2-298268 | | 12/1990 | | |
| JP | 5-10818 | | 2/1993 | | |
| JP | 5-106020 | | 4/1993 | | |
| JP | 5-61734 | | 8/1993 | | |
| JP | 5-51947 | | 9/1993 | | |
| JP | 6-240454 | | 8/1994 | | |
| JP | 07-326490 | | 12/1995 | | |
| JP | 9-3639 | | 1/1997 | | |
| JP | 9-87835 | | 3/1997 | | |
| JP | 09087837 A | * | 3/1997 | ........... | C23C/14/34 |
| JP | 9-111446 | | 4/1997 | | |
| JP | 10-88336 | | 4/1998 | | |

* cited by examiner

Primary Examiner—Gregg Cantelmo
(74) Attorney, Agent, or Firm—Burns, Doane, Swecker & Mathis, L.L.P.

(57) ABSTRACT

The stray capacitance between the target and grounding member and the loss of high frequency electric current are reduced by arranging dielectric members and metal members with a particular configuration at the circumference of the cathode and target.

17 Claims, 11 Drawing Sheets

HIGH FREQUENCY SPUTTERING DEVICE

CROSS-REFERENCE TO RELATED APPLICATIONS

This application claims priority of Japanese Patent Application No. 2000-180933, filed in Japan on Jun. 16, 2000, the entire contents of which are hereby incorporated herein by reference.

BACKGROUND OF THE INVENTION

1. Field of the Invention

The present invention relates to a high frequency sputtering device, and in particular to a high frequency sputtering device having a grounding shield which is arranged at the circumference of the target.

2. Description of Related Art

Figure 10:
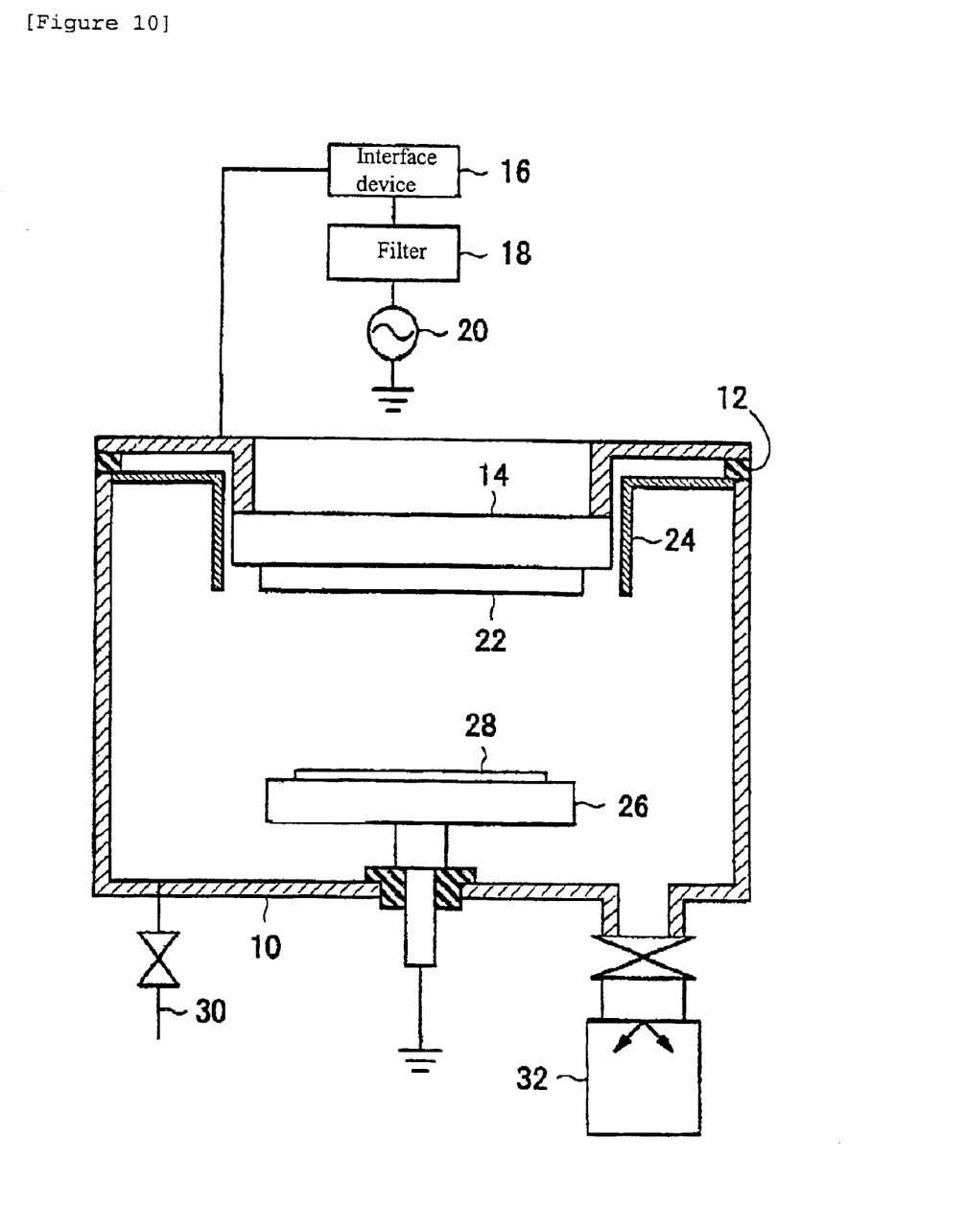
FIG. 10 is a sectional front view of a conventional high frequency sputtering device.

In the field of semiconductor devices, there is increasing integration and miniaturization of the elements. In order to respond to this, semiconductor manufacturing processes are carried out using high frequency sputtering devices for such operations as filling film inside minute holes. FIG. 10 is a sectional front view of a high frequency sputtering device. A circular cathode 14 is mounted at the mouth of the upper part of a processing chamber 10 by means of an insulator 12. An interface device 16, filter 18 and high frequency power supply 20 are connected in series with this cathode 14. A target 22 is mounted on the lower face of the cathode 14. A cylindrical grounding shield 24 is mounted on the processing chamber 10 in such a way that it surrounds the cathode 14 and the target 22. As shown in a magnified view in FIG. 11, the gap between the grounding shield 24 and the cathode 14 is narrow, being approximately 2 mm. The size of this gap is sufficiently smaller than the sheath thickness necessary to support plasma, in order to prevent plasma from entering the gap. The substrate holder 26 is arranged inside the processing chamber 10 so as to be opposite the target 22. A substrate 28 is mounted on this substrate holder 26.

The operation of this high frequency sputtering device will now be explained. Plasma is generated between the target 22 and the substrate 28 when the processing chamber 10 is exhausted by means of an exhaust device 32, electric discharge gas is introduced from a gas feeder in device 30 and high frequency electric power is applied to the cathode 14. Ions in this plasma are sputtered on to the target 22, particles of the target 22 are scattered, and these particles adhere to the surface of the substrate 28, so that a thin film is deposited on the surface of the substrate 28. The high frequency generally used in the high frequency power supply 20 is 13.56 MHZ.

In the conventional device in FIG. 10, because the gap between the grounding shield 24 on the one hand and the cathode 14 and target 22 on the other is narrow and long, large stray capacitances are generated in this gap part. The problem occurs that some of the high frequency electric current supplied from the high frequency power supply 20 flows into this stray capacitance and high frequency electric current is lost. This problem becomes particularly acute at high frequencies.

For this reason, a high frequency sputtering device in which the grounding shield is reticulate and the stray capacitance is small has been designed. See Japanese Patent No. 2832360. However, further problems arise with a reticulate grounding shield, such as the fact that its configuration is fragile and abnormal electric discharges are generated at the reticulate shield.

In addition, techniques are known in which the stray capacitance is reduced by laminating a plurality of metal plates on the rear surface of the electrode in order to reduce the loss of high frequency current in a CVD device (plasma CVD device) which uses plasma excited by high frequency waves. See Japanese Laid-Open Application No. S59-63775. However, this reference makes no mention of measures for reducing the stray capacitance when a grounding shield is provided at the circumference of the electrode. In the sputtering device there is the problem that, in order to prevent particles discharged from the target from adhering to the inner wall of the device, becoming detached, dropping down and forming particulates which contaminate the substrate, a grounding shield is provided in order to cover the end part of the target, and a large stray capacitance is generated between this grounding shield and the target. In the above-mentioned plasma CVD device, because only the stray capacitance of the rear face of the electrode is reduced, even if a sputtering device of such a configuration is used it is not possible to reduce the stray capacitance between the grounding shield and the target and the problem of the loss of high frequency current cannot be solved.

OBJECTS AND SUMMARY

The present invention is aimed at solving the above-mentioned problems and one of its objects is to provide a high frequency sputtering device which can prevent the loss of high frequency current due to stray capacitance, but which does not have a fragile configuration and in which abnormal electric discharges are not generated.

In one embodiment of a high frequency sputtering device according to the present invention, an annular dielectric member is in contact with an outer circumferential face of a cathode. A projecting part of the dielectric member projects further toward the target than the target mounting face of the cathode. An annular metal member is mounted on the projecting part and the metal member is formed in such a way that it preferably projects 3 mm or more further inward than the inner circumferential face of the projecting part of the dielectric member. The minimum distance between the metal member and the target is preferably made 3 mm or less. By employing such a configuration, the stray capacitance between the cathode and target on the one hand and the grounding member on the other is reduced and the loss of high frequency current is reduced. Moreover the configuration is not fragile and abnormal electric discharges are not generated.

High frequency sputtering devices also rely on the pressure of gas inside the processing chamber. If a gap within the chamber is 3 mm, or less, and if the length of the gap reaches 3 mm, or more, plasma cannot enter such a gap. If plasma cannot enter the gap, the risk of the members which form the gap being sputtered by ions in the plasma is reduced. Therefore, in this invention, the gap between the metal members of the target is preferably made 3 mm or less, and the amount of projection toward the inner side of the metal members (approximately equal to the length of the gap) is made 3 mm or more.

The metal members can also be grounded (in other words placed in contact with the processing chamber) or it can be electrically insulated from the processing chamber. In addition, it is desirable to make these metal members from the same material as the target. If they are made from the same material, even if the metal members are sputtered and sputter particles from the metal members become mixed into the thin film formed on the substrate, this does not cause contamination of the thin film.

A plurality of metal members can be provided. In such cases, it is desirable to bend the gap between the metal members in such a way that it is not possible to look through from the mouth part of the gap to the surface of the dielectric member. As a result, even if sputter particles penetrate the interior of the gap from the mouth part of the gap, the sputter particles cannot reach the surface of the dielectric member because they travel in a straight line. Therefore, it is possible to prevent a situation in which a film is deposited on the surface of the dielectric member and the metallic members short-circuited to one another.

BRIEF DESCRIPTION OF THE DRAWINGS

FIG. 9 is a sectional view of a seventh embodiment of the present invention, as in FIG. 3.

DETAILED DESCRIPTION OF THE PREFERRED EMBODIMENTS

Figure 1:
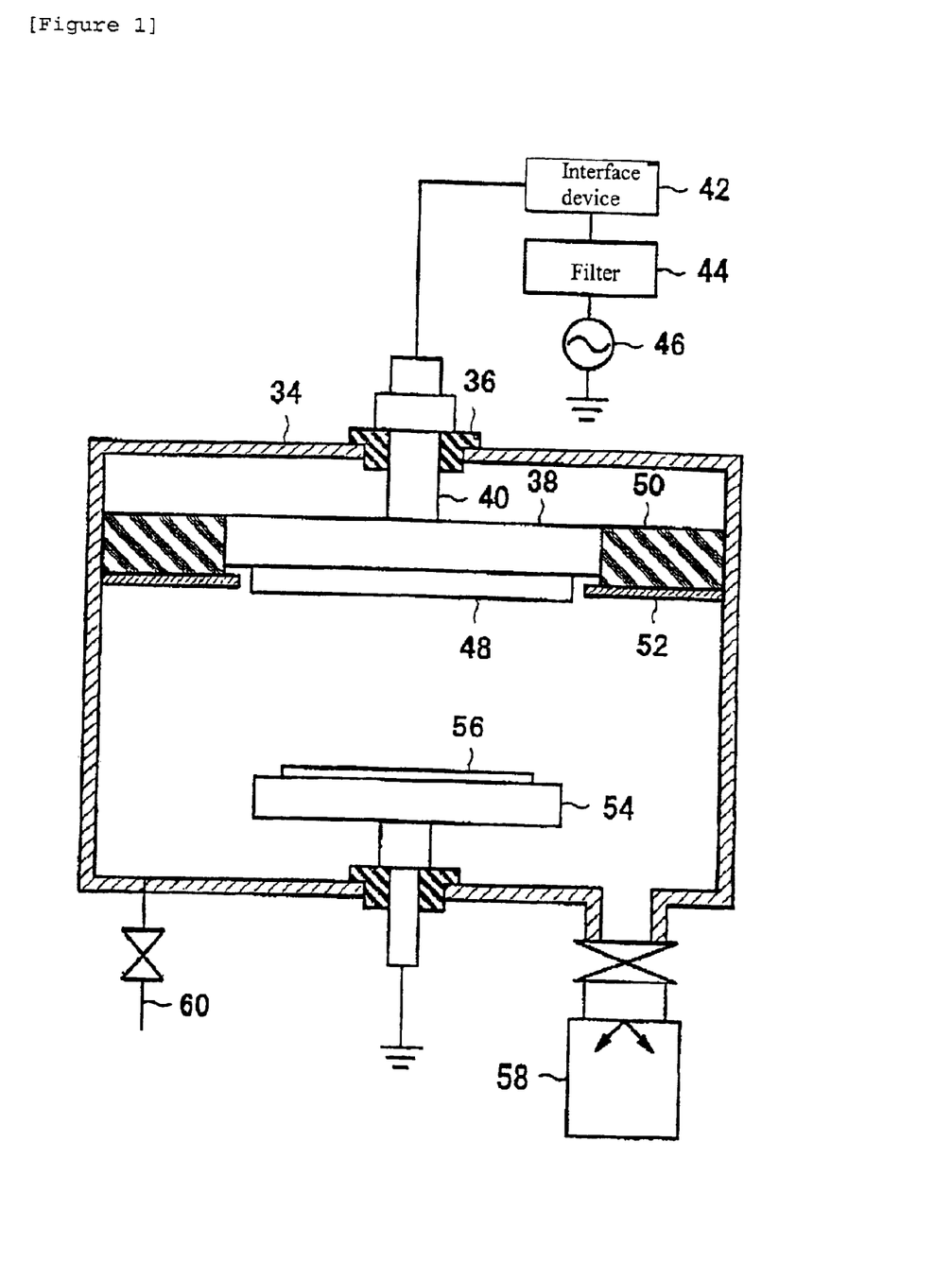
FIG. 1 is a sectional front view of a first embodiment of the present invention.

Embodiments of the present invention are explained below with reference to the Figures. The first embodiment of the present invention is shown in a sectional front view. A shaft 40 of a cathode 38 is mounted on an upper part of a processing chamber 34 by means of an insulator 36. An interface device 42, a filter 44 and a high frequency power supply 46 are connected in series with the shaft 40. A target 48 is mounted on the lower face of the cathode 38. An inner circumferential face of an annular dielectric ring 50 is placed in contact with an outer circumferential face of the circular cathode 38. An outer circumferential face of the dielectric ring 50 is in contact with the inner face of the side wall (cylindrical) of the processing chamber 34. A hollow circular plate-shaped metal ring 52 is mounted on a lower face of the dielectric ring 50. The dielectric ring 50 and the metal ring 52 will be explained in detail later. A substrate holder 54 is arranged inside the processing chamber 34 in such a way that it faces the target 48. A substrate 56 is mounted on this substrate holder 54. The processing chamber 34 is at ground potential. In this embodiment, the substrate holder 54 is also at ground potential.

The operation of this high frequency sputtering device will now be explained. Plasma is generated between the target 48 and the substrate 56 when the processing chamber 34 is exhausted by means of an exhaust device 58, electric discharge gas is introduced from a gas feeder device 60 and a high frequency current is applied to the cathode 38. Ions in this plasma sputter onto the target 48, particles from the target 48 are dispersed, and these particles adhere to the surface of the substrate 56, so that a thin film is deposited on the surface of the substrate 56. In this embodiment, the frequency of the high frequency power supply 46 is 13.56 MHZ.

Figure 2:
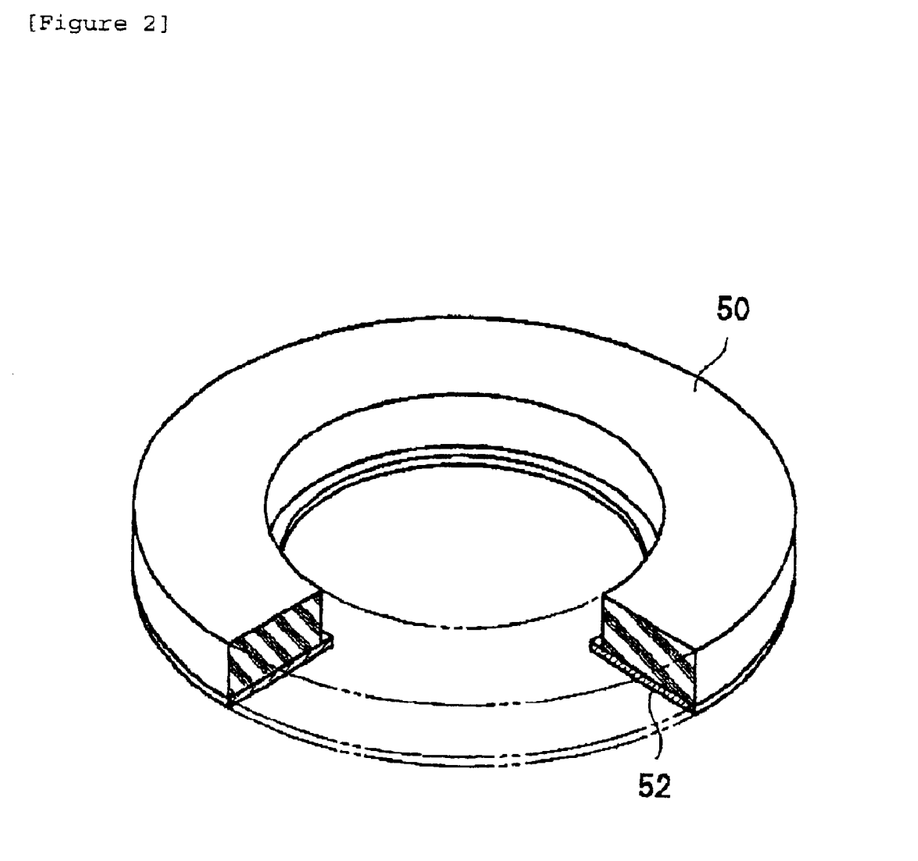
FIG. 2 is an oblique, partially broken-open view of a dielectric ring and metal ring of the spluttering device according to FIG. 1.

FIG. 2 is an oblique, broken-open view of the dielectric ring 50 and the metal ring 52. As shown in FIG. 2, the dielectric ring 50 and the metal ring 52 are circular and are integrally coupled. The material of the dielectric ring 50 is, for example, polytetrafluoroethylene, quartz, aluminum oxide, or the like.

Figure 3:
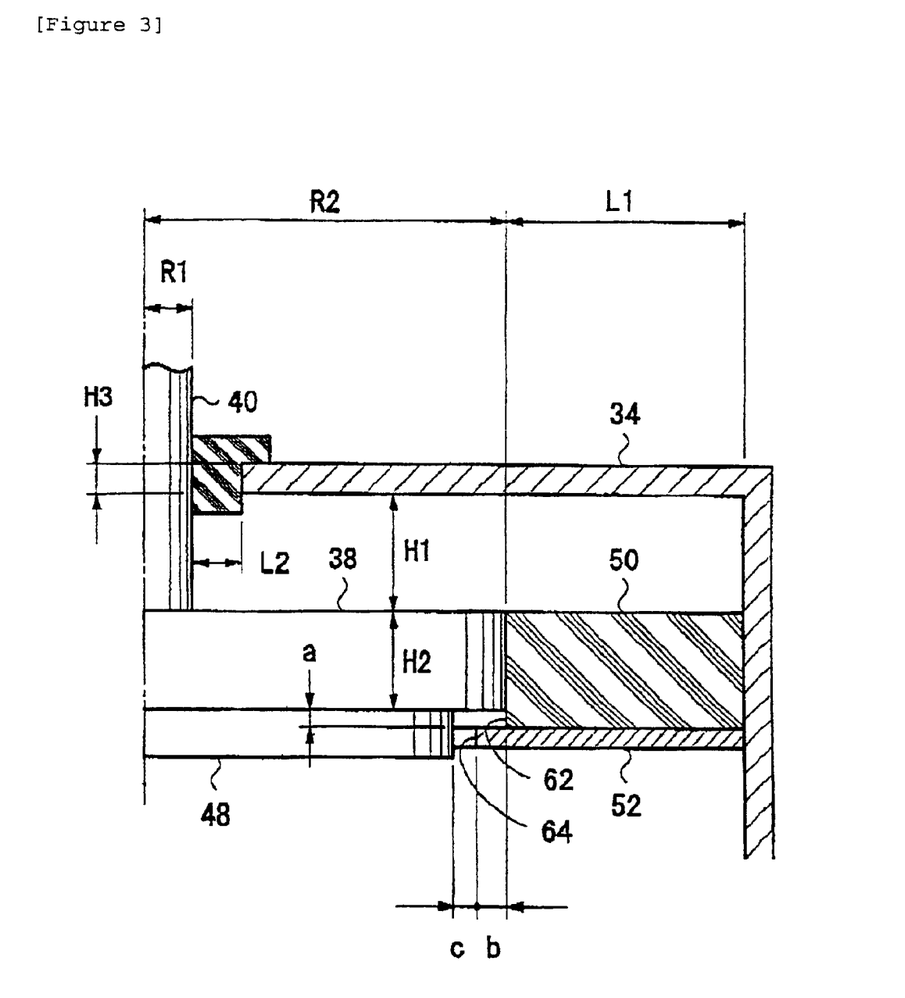
FIG. 3 is a magnified sectional front view of a section through the dielectric ring and metal ring of the sputtering device according to FIG. 1.

FIG. 3 is a magnified sectional front view showing the vicinity of a section through the dielectric ring 50 and the metal ring 52. The inner circumferential face of the dielectric ring 50 is in contact with the outer circumferential face of the cathode 38. The dielectric ring 50 projects downward by a distance "a" from the lower face of the cathode 38. This part of the dielectric ring 50 extending below the lower face of the cathode 38 is referred to as the projecting part of the dielectric ring 50. The hollow circular plate-shaped metal ring 52 is mounted on the lower face of this projecting part. The metal ring 52 is 3 mm thick, although other thicknesses may be used. The metal ring 52 is arranged parallel with the surface of the target 48. The distance between the upper face of the metal ring 52 and the lower face of the cathode 38 is the same as "a". The inner circumferential edge 64 of the metal ring 52 projects inward by a distance "b" from the inner circumferential face 62 of the dielectric ring 50. Because the metal ring 52 projects inward from the dielectric ring 50 in this way, it becomes difficult for film to be deposited on the inner circumferential face 62 of the dielectric ring 50. The inner circumferential edge 64 of the metal ring 52 is spaced apart from the outer circumferential face of the target 48 by a distance "c". The outer circumferential edge of the metal ring 52 is in contact with the inner face of the side wall of the processing chamber 34. In this embodiment, a=2.5 mm, b=3 mm and c=2.5 mm, although other distances may also be used. Therefore, the gap between the metal ring 52 and the cathode 38 (distance a) is 2.5 mm and the gap between the metal ring 52 and the target 48 is 2.5 mm (distance c). In addition, the depth of the gap, which is the shortest path extending from the entrance of the gap to the inner circumferential face 62, is the sum total of the thickness of the metal ring 52 (3 mm) and the length by which the metal ring projects (b=3 mm), and is approximately 6 mm. In this way, because the width of the gap is 3 mm, or less, and the depth of the gap is 3 mm, or more, plasma does not enter the gap. Consequently, film is not deposited on the inner circumferential face of the projecting part of the dielectric ring 50, and the cathode 38 and target 48 do not short-circuit to the metal ring 52 (in other words there is no short-circuiting to the processing chamber 34).

Figure 11:
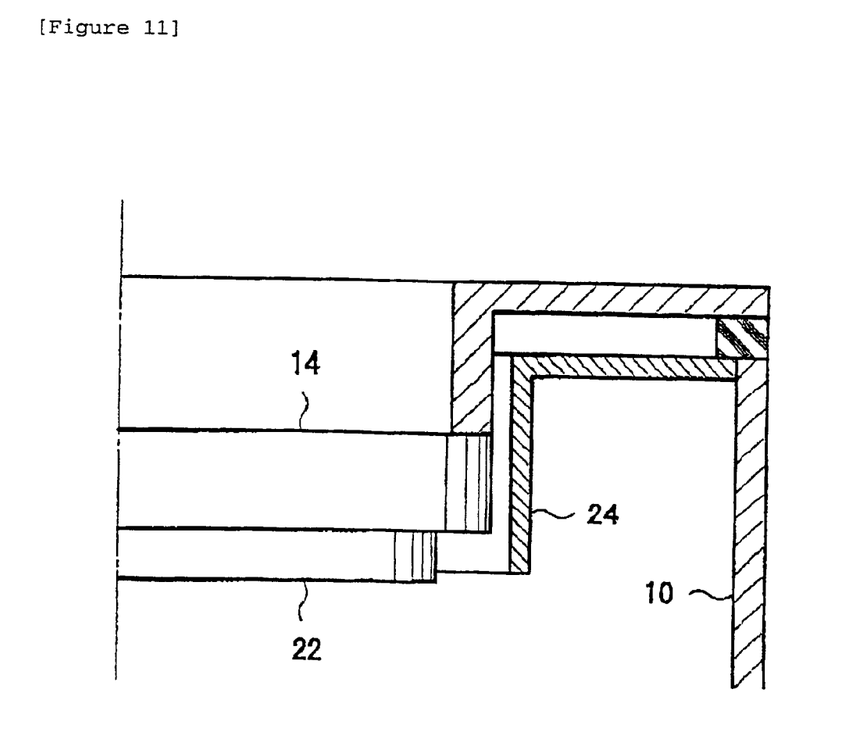
FIG. 11 is a magnified sectional front view showing a section through the dielectric ring and metal ring of the sputtering device according to FIG. 10.

If the configuration of FIG. 3 is compared with the configuration of the device in FIG. 11, in the configuration of the device in FIG. 11, the cylindrical grounding shield 24 is mounted so as to surround the cylindrical cathode 14, whereas in the configuration according to FIG. 3 the hollow circular plate-shaped metal ring 52 which is parallel with the surface of the target 48 is merely mounted so as to surround the vicinity of the outer circumference of the target 48. Therefore compared to the configuration according to the device in FIG. 11, in the configuration according to FIG. 3 the stray capacitance between the metal ring 52 (performing the function of the grounding shield) and the target 48 becomes extremely small. Therefore, the loss of high frequency electric current is reduced.

The embodiment of FIG. 3 employs a configuration comprising a dielectric ring 50 and metal ring 52, instead of the conventional grounding shield, in order to reduce the stray capacitance between the cathode 38 and the grounding shield. In this context, in order to make the device efficient, it is useful to prevent the stray capacitance between the cathode 38 and processing chamber 34 from becoming large in other components. Therefore, it is desirable to configure the distance between the cathode 38 and the parts of the processing chamber 34 generally as follows. Firstly, it is preferable for the distance L2 between the outer circumferential face of the shaft 40 of the cathode 38 and the inner circumferential face of the mouth part of the top plate of the processing chamber 34 to be made 5 mm or more, and for the distance H3 in the height direction of the gap part of this distance L2 to be made 150 mm or less. In addition, it is preferable for the distance H1 between the upper face of the cathode 38 and the lower face of the top plate of the processing chamber 34 to be made 20 mm or more, for the distance L1 between the outer circumferential face of the cathode 38 and the inner face of the side wall of the processing chamber 34 to be made 20 mm or more, and for the distance H2 in the height direction of the gap part of this distance L1 to be made 50 mm or less. However, other distances may suffice depending upon other factors including the frequency and power levels used.

When the stray capacitance generated when high frequency electric power is applied to the cathode 38 and target 48 configured as shown in FIG. 3 is tested, the following occurs. If the radius R1 of the shaft 40 of the cathode 38 is made 20 mm, the radius R2 of the cathode 38 is made 140 mm, the distance L1 to the inner face of the side wall of the processing chamber 34 from the outer circumferential face of the cathode 38 is made 20 mm, the distance H1 to the upper face of the cathode 38 from the lower face of the top plate of the processing chamber 34 is made 20 mm, the thickness H2 of the cathode 38 made 50 mm, and the dimensions relating to the gap are as mentioned above a=2.5 mm, b=3 mm, c=2.5 mm, then the stray capacitance between the cathode 38 and target 48 on the one hand and the grounding potential (processing chamber 34 and metal ring 52) on the other is approximately 4–5 pF when the high frequency is 13.56 MHZ.

In contrast with this, in the configuration according to FIG. 11, when the dimensions of the cathode 14 are made approximately the same as in FIG. 3, the stray capacitance between the cathode 14 and target 22 on the one hand and the grounding potential (processing chamber 10 and ground shield 24) on the other rises drastically to about 10,000 pF.

It should be noted that in the configuration according to FIG. 3, when the aim is just to reduce the stray capacitance, the stray capacitance is reduced more when the dielectric ring 50 is not present (because the dielectric constant of the dielectric is greater than the dielectric constant of a vacuum), but it is not preferable to remove the dielectric ring 50 because then there would be the risk of plasma entering the resulting space. In addition, the dielectric ring 50 performs the function of mechanically supporting the outer circumferential face of the cathode 38.

The metal ring 52 is preferably made from the same material as the target 48. However, it can be made from other materials. Because it is assumed that a metal target 48 is used in this high frequency sputtering device, it is possible to make the metal ring 52 and the target 48 from the same material. If they are made from the same material, even if the metal ring 52 is sputtered and sputter particles from the metal ring are mixed in with the thin film which is formed on the substrate, this does not cause contamination of the thin film.

Figure 4:
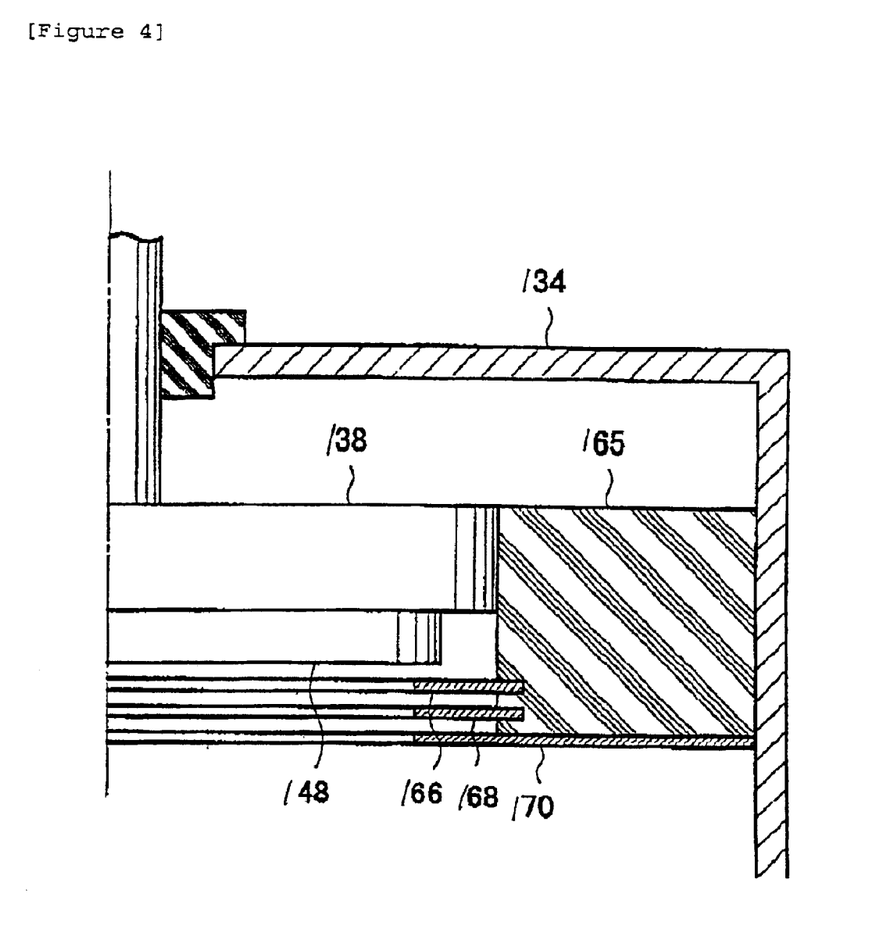
FIG. 4 is a sectional view of a second embodiment of the present invention, as in FIG. 3.

FIG. 4 is a sectional view of a second embodiment of the present invention, as in FIG. 3. In this embodiment, three metal rings 166, 168, 170 are mounted one on top of the other in parallel, leaving spaces between them, in the vicinity of the lower face of the dielectric ring 165. The metal rings 166, 168, 170 preferably are each 3 mm thick. The distance between the upper face of the upper metal ring 166 and the lower face of the target 148 is 2.5 mm, while the spaces between the three metal rings 166, 168, 170 are also preferably 2.5 mm. The inner circumferential edges of the three metal rings 166, 168, 170 project inwardly preferably by only 6 mm from the inner circumferential face of the dielectric ring 165. The lower metal ring 170 covers the lower face of the dielectric ring 165, and the outer circumferential edge of the metal ring 170 is in contact with the inner face of the side wall of the processing chamber 134. Therefore, the two upper metal rings 166, 168 are electrically floating, while only the lowermost metal ring 170 is at ground potential. It is possible that alternative distances may be used, depending upon other factors such as the supplied power and desired results.

In this embodiment also, because the gap between the target 148 and the metal ring 166 is 3 mm or less and the depth of the gap is 3 mm or more, plasma does not enter the gap. Consequently, film is not deposited on the inner circumferential face of the dielectric ring 165, and the cathode 138 and metal ring 166 do not short-circuit. In addition, because the gap between the metal rings 166, 168, 170 is narrow, being only 2.5 mm, plasma is not generated in the gap, and the metal rings are not sputtered by plasma. Therefore, film is not deposited on the inner circumferential face (the inner circumferential face which is exposed to the gap between the metal rings) as a result of such sputtering. Consequently, the metal rings 166, 168, 170 do not short-circuit one another and there is no risk of the stray capacitance increasing.

In this embodiment, because the three metal rings 166, 168, 170 are arranged in parallel leaving spaces between them, the stray capacitance is less than when one ring is arranged. This point will now be explained. If the stray capacitance between the target 148 and the lower metal ring 170 (grounded) is C, the stray capacitance between the target 148 and the upper metal ring 166 is $C_1$, the stray capacitance between the upper metal ring 166 and the central metal ring 168 is $C_2$, and the stray capacitance between the central metal ring 168 and the lower metal ring 170 is $C_3$, the following formula is obtained.

$$1/C = 1/C_1 + 1/C_2 + 1/C_3$$

Therefore, the greater the number of laminated metal rings, the greater the overall reduction in stray capacitance C.

Figure 5:
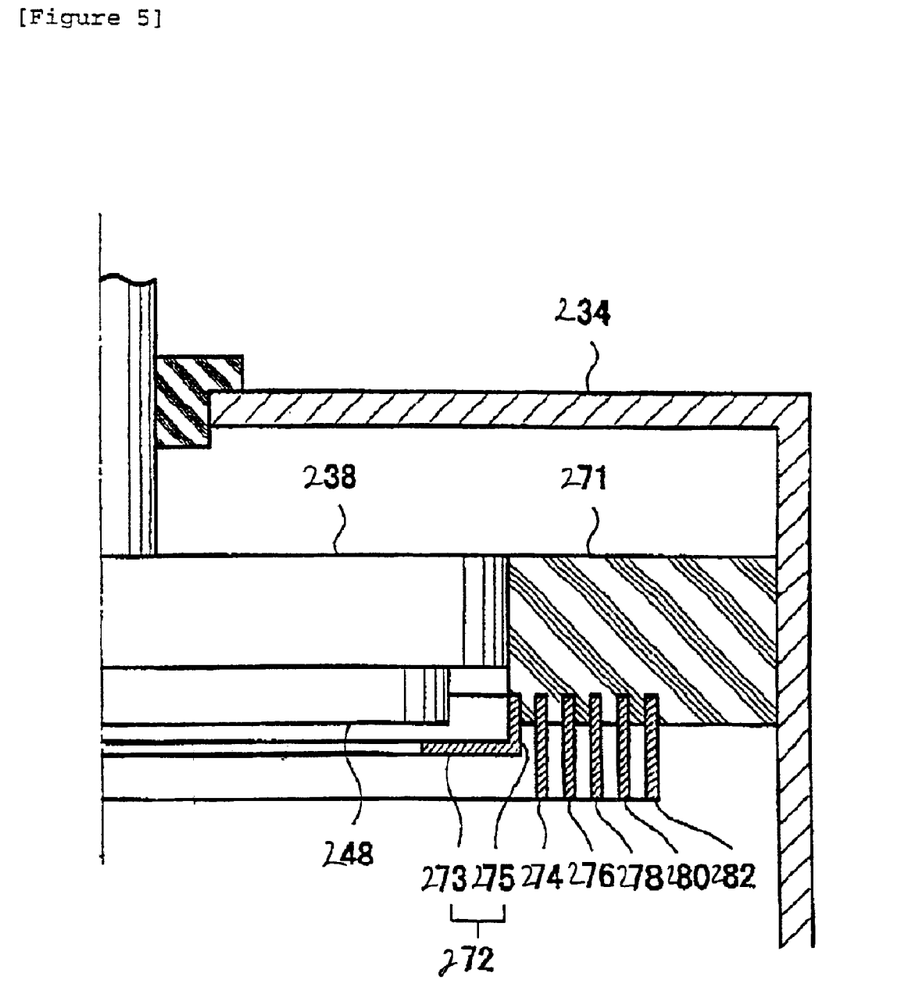
FIG. 5 is a sectional view of a third embodiment of the present invention, as in FIG. 3.

FIG. 5 shows a sectional view of a third embodiment of the present invention, as in FIG. 3. In this embodiment, six metal rings 272, 274, 276, 278, 280, 282 are mounted concentrically in the vicinity of the upper face of the dielectric ring 271. The innermost metal ring 272 has an L-shaped section. This metal ring 272 is composed of a hollow circular plate-shaped horizontal part 273 which is parallel with the surface of the target 248 and of a cylindrical vertical part 275 which is perpendicular to the horizontal part 273. The inner circumferential edge of the horizontal part 273 projects inwardly by only 5 mm from the inner circumferential face of the dielectric ring 271. The vertical part 275 is approximately in the same position as the inner circumferential face of the dielectric ring 271. The distance between the upper face of the horizontal part 273 and the surface of the target 248 is approximately 2 mm. Five cylindrical metal rings 274, 276, 278, 280, 282 with different diameters are arranged concentrically on the outside of the metal ring 272 with an L-shaped section. The sectional shape of these cylindrical metal rings is perpendicular to the surface of the target 248, and projects downward by only 7 mm from the lower face of the dielectric ring 271. The gap between these cylindrical metal rings is approximately 2 mm in each case. The gap between the vertical part 275 of the L-shaped metal ring 272 and the innermost cylindrical metal ring 274 is approximately 2 mm. However, alternatively, other distances may be used instead of those set forth above.

In this embodiment, the six metal rings are electrically floating because they are not in contact with the cathode 238, target 248 or the processing chamber 234. Therefore, the stray capacitance between the target 248 and the grounding member (the processing chamber 234 in this case) is determined by the capacitive series connection between the target 248, the six metal rings and the processing chamber 234.

Figure 6:
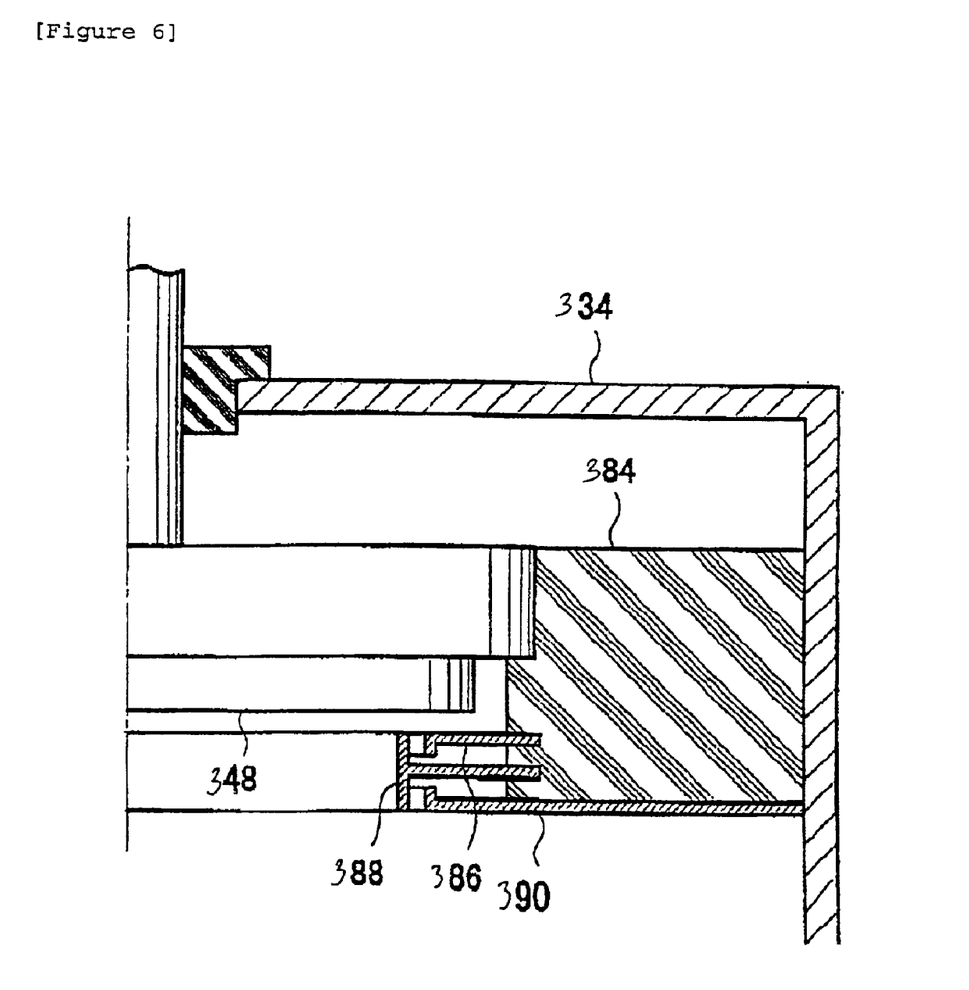
FIG. 6 is a sectional view of a fourth embodiment of the present invention, as in FIG. 3.

FIG. 6 is a sectional view of a fourth embodiment of the present invention, as in FIG. 3. In this embodiment, three metal rings 386, 388, 390 are mounted aligned one on top of the other in the vicinity of the lower face of the dielectric ring 384. The sectional shape of these metal rings will be explained below. The upper metal ring 386 and lower metal ring 390 project inward by only 5 mm from the inner circumferential face of the dielectric ring 384. The end of the metal ring 386 is bent downward perpendicularly by only 2 mm. The end of the lower metal ring 390 is bent upward perpendicularly by only 2 mm. The lower metal ring 390 covers the lower face of the dielectric ring 384 and its outer circumferential edge is in contact with the inner face of the side wall of the processing chamber 334. The gap between the upper face of the upper metal ring 386 and the surface of the target 348 is approximately 2 mm. The central metal ring 388 projects inward by only 10 mm from the inner circumferential face of the dielectric ring 384. The end of the metal ring 388 is extended upward and downward, and the overall sectional shape of the metal ring 388 takes on the form of a capital T. The three metal rings 386, 388, 390 are all 3 mm thick. The gaps between the upper and lower metal rings 386, 390 on the one hand and the central metal ring 388 on the other are bent at a right angle. The horizontal and vertical gaps between the end component of the central metal ring 388 and the end components of the upper and lower metal rings 386, 390 are 2 mm. In this way, by making right-angled bends in the gaps between the metal rings it becomes impossible to look through to the surface of the dielectric ring from the mouth part of the gap, with the result that even if sputter particles penetrate these gaps from the exterior, it is difficult for these sputter particles to reach the inner circumferential face of the dielectric ring 384. Therefore, compared with the embodiment in FIGS. 3 to 5, it is extremely difficult for film to become deposited on the inner circumferential face of the dielectric ring 384 which is exposed to the gap between the metal rings. In addition, plasma cannot enter the gap between the target 348 and the metal ring 386, or the gap between the metal rings. In this embodiment, only the lower metal ring 390 is at ground potential, and the upper metal ring 386 and the central metal ring 388 are electrically floating. However, alternatively, other distances may be used instead of those set forth above.

Figure 7:
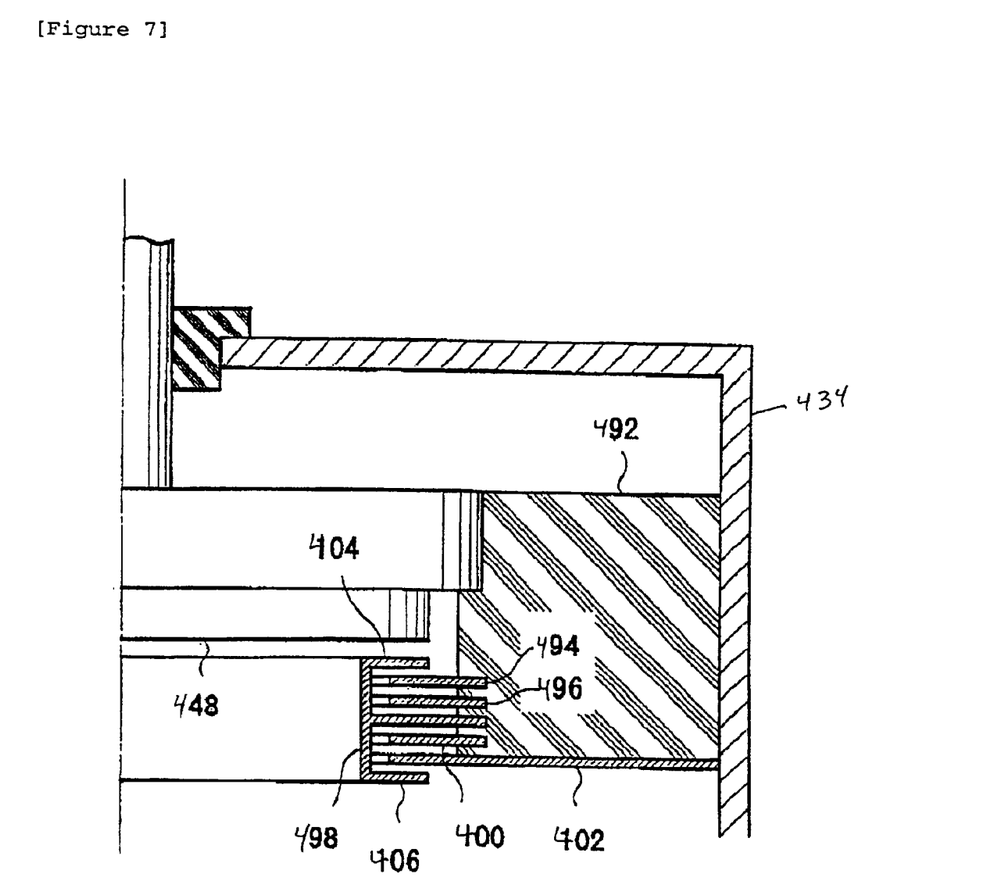
FIG. 7 is a sectional view of a fifth embodiment of the present invention, as in FIG. 3.

FIG. 7 is a sectional view of a fifth embodiment of the present invention, as in FIG. 3. In this embodiment, the five metal rings 494, 496, 498, 400, 402 are mounted aligned one on top of the other in the vicinity of the upper face of a dielectric ring 492. The sectional shape of these metal rings will be explained below. The metal rings 494, 496, 400, 402, which with the exception of the central metal ring 498 are flat, project inward by only 5 mm from the inner circumferential face of the dielectric ring 492. The lowermost metal ring 402 covers the lower face of the dielectric ring 492 and its outer circumferential edge is in contact with the inner face of the side wall of the processing chamber 434. It projects inwardly by only 5 mm from the inner circumferential face of the dielectric ring 492. The end of the metal ring 498 is extended in the upward and downward direction, and in addition the upper and lower ends are bent back in the outer radial direction. The upper bent-back part 404 covers the vicinity of the end of the uppermost metal ring 494, and the lower bent-back part 406 covers the vicinity of the end of the lowermost metal ring 402. In this way, the entire sectional shape of the central metal ring 498 is shaped like a trident. Therefore, the right-angled bent part in the gap between the central metal ring 498 and the other metal rings is formed in two portions. The vertical gap between the five metal rings is 2 mm. The horizontal gap between the inner circumferential edge of the flat metal rings 494, 496, 400, 402 and the end part of the central metal ring 498 is also 2 mm. The gap between the upper face of the upper bent-back part 404 and the surface of the target 448 is approximately 2 mm.

In this embodiment also, in the same way as in the embodiment in FIG. 6, the gap between the metal rings is bent at a right-angle, and it becomes impossible to look through to the surface of the dielectric ring from the mouth part of the gap, with the result that, compared to the embodiments in FIGS. 3 to 5, it becomes extremely difficult for particles to pass through this gap, and it becomes extremely difficult for film to be deposited on the inner circumferential face of the dielectric ring 492 which is exposed to the gap between the metal rings. In addition, plasma cannot enter the gap between the target 448 and the metal ring 498 or the gap between the metal rings.

The foregoing distances are examples of one embodiment. Alternative embodiments using different distances may be contemplated by the present invention.

Figure 8:
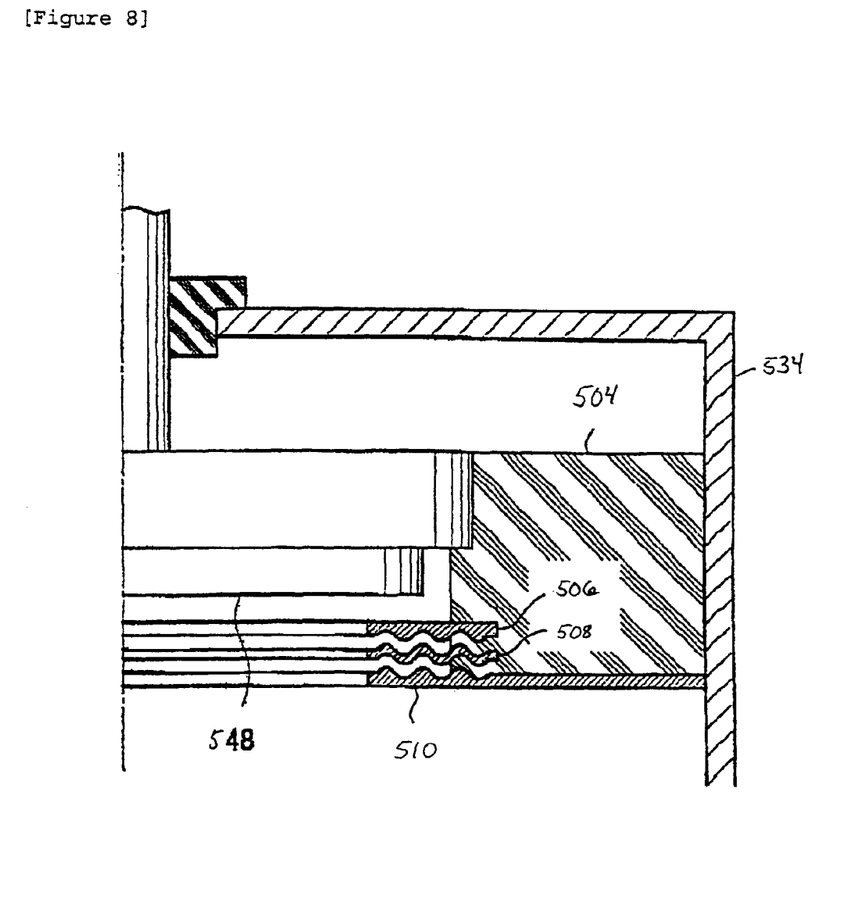
FIG. 8 is shows a sectional view of a sixth embodiment of the present invention, as in FIG. 3.

FIG. 8 is a sectional view of a sixth embodiment of the present invention, as in FIG. 3. In this embodiment, three metal rings 506, 508, 510 are mounted one on top of the other leaving spaces between them, in the vicinity of the lower face of the dielectric ring 504. The sectional shape of these metal rings will be explained below. The lower face of the upper metal ring 506 and the upper face of the central metal ring 508 are given mutually complementary undulating shapes. The gap between them is 2 mm. In addition, the lower face of the central metal ring 508 and the upper face of the lower metal ring 510 are given mutually complementary undulating shapes and the gap between them is 2 mm. The distance between the upper metal ring 506 and the surface of the target 548 is 2.5 mm. The inner circumferential edge of the three metal rings 506, 508, 510 projects inward by only 6 mm from the inner circumferential face of the dielectric ring 504. The lower metal ring 510 covers the lower face of the dielectric ring 504, and its outer circumferential edge is in contact with the inner face of the side wall of the processing chamber 534. Therefore, the two metal rings 506, 508 which are the upper ring and central ring are electrically floating while only the lower metal ring 510 is at ground potential. In this embodiment, the gap between the three metal rings is given an undulating shape and it becomes impossible to look through to the surface of the dielectric ring from the mouth part of the gap, with the result that, compared with the embodiment in FIG. 3, it is extremely difficult for sputter particles to pass through this gap, and it is extremely difficult for film to be deposited on the inner circumferential face of the dielectric ring 504. In addition, plasma cannot enter the gap between the target 548 and the metal ring 506 or the gap between the metal rings.

FIG. 9(*a*) is a sectional view of a seventh embodiment of the present invention, as in FIG. 3. In this embodiment, firstly the section of the dielectric ring 614 is shaped in a special way. In this dielectric ring 614, the inner circumferential face of the component which projects in a downward direction from the lower face of the cathode 638 has a sectional shape as follows. Firstly, there is the component 606 which projects downwardly from the outer diameter of the cathode 638, and the lower side of said component 606 becomes the turned back part 618 which is turned back toward the outer radial direction. In addition, on the lower side of the turned back part 618 there are two plate parts 620, 622 which project inwardly by only 6 mm from said turned back part 618. The two plate parts 620, 622 are formed with a space of 2 mm between them in the upward and downward directions. The plate parts 620, 622 are 4 mm thick. Four mm-thick metal rings 624, 626 are mounted on the inner circumferential edge of the plate parts 620, 622. The width in the radial direction of the metal rings 624, 626 is reduced to 3 mm. The distance between the upper face of the metal ring 624 and the surface of the target 648 is 2.5 mm. The lower face of the dielectric ring 614 is covered by the 4 mm-thick metal ring 628. The inner circumferential edge of the metal ring 628 projects inward as far as the same position as the metal rings 624, 626, while the outer edge of the metal ring 628 is in contact with the inner side of the side wall of the processing chamber 634. The gap between the metal ring 626 and the metal ring 628 is 2 mm. This embodiment is similar to the embodiment in FIG. 4, but, compared to the metal rings 166, 168 in the embodiment according to FIG. 4, the surface area of the metal rings 624, 626 according to FIG. 9 are smaller. Therefore, the loss of high frequency electric current due to stray capacitance becomes smaller than in the embodiment according to FIG. 4. However, alternatively, other distances may be used instead of those set forth herein.

FIG. 9(*b*) is a magnified view showing the specific mounting configuration of the above-mentioned metal rings 624, 626. The metal rings 624, 626 are engaged in the plate parts 620, 622 in such a way that they surround the inner circumferential edges of the plate parts 620, 622 of the dielectric ring 614. FIG. 9(*c*) is a magnified view showing another mounting configuration of the metal rings 624', 626'. The metal ring 626' is supported by a plurality of supports 630 which are fitted in an upright position on the lower metal ring 628'. In addition, the upper metal ring 624' is also supported by a plurality of supports 632 which are fitted to the metal ring 626' in an upright position.

In the various embodiments shown in FIGS. 4 to 9, as in the embodiment of FIG. 3, the metal rings are also preferably made from the same material as the target, with the result that even if these metal rings are sputtered, and the sputter particles from the metal ring become mixed into the thin film formed on the substrate, this does not cause contamination of the thin film.

The present invention is not restricted to the embodiments above, but rather modifications are possible, including, but not limited to:

(1) In the various embodiments above, the sectional shape of the metal ring was parallel with or perpendicular to the surface of the target but it may also be at a right angle with respect to the surface of the target.

(2) In the various embodiments above, the cathode and the target are circular and the dielectric ring and the metal ring are annular, but if the cathode and the target were, for example, rectangular, the dielectric ring and the metal ring could also be in the shape of rectangular rings.

(3) In the various embodiments above, the target is attached directly to the cathode, but it is also possible to attach the target to the cathode by means of a packing plate.

(4) The present invention can be applied to what is known as a magnetron cathode in which a magnet is arranged on the inner part of the cathode, and can also be applied in ordinary cathodes in which no magnet is arranged.

(5) In the embodiment of the above according to the above-mentioned FIG. 1, the substrate holder 54 is grounded, but it is also possible for the substrate holder 54 to be electrically insulated from the processing chamber 34, and in that case it is also possible to apply a bias voltage to the substrate holder 54.

In the high frequency sputtering device according to the present invention, the stray capacitance between the target and the grounding member and the loss of high frequency electric current are reduced in comparison with a conventional device by arranging dielectric members and metal members in a particular configuration at the circumference of the cathode and target. What is more, the configuration is not fragile and abnormal electrical discharges are not generated.

What is claimed is:

1. A high frequency sputtering device, comprising:
  a processing chamber having an axially extending side wall;
  a high frequency power supply;
  a cathode inside the processing chamber, the cathode being electrically insulated from the processing chamber and connected to the high frequency power supply, the cathode extending only along a given axial extent of the side wall of the processing chamber;
  a target mounted on a first side of the cathode; and
  a grounded metal shield mounted in the processing chamber adjacent to the cathode but only in a location outside of the given axial extent of the cathode, the metal shield having an opening in a central portion thereof, wherein an outer circumferential edge of the metal shield is electrically grounded to the processing chamber;
  the processing chamber, cathode, and the grounded metal shield are arranged such that only a dielectric material is between the cathode and the wall of the processing chamber within the axial extent of the cathode;
  the metal shield is arranged so as to form a gap having a first portion between the metal shield and the cathode and a second portion between the metal shield and the target, wherein the gap is sufficiently narrow and sufficiently long so as to substantially prevent plasma from passing through the gap, wherein the gap includes a bend between the first portion and the second portion so that the gap is substantially L-shaped.

2. The high frequency sputtering device as claimed in claim 1, wherein the metal shield is located in radial alignment with the target.

3. The high frequency sputtering device as claimed in claim 1, wherein the metal shield is located at a side of the target.

4. The high frequency sputtering device as claimed in claim 1, wherein the target and the metal shield are made of the same material.

5. The high frequency sputtering device as claimed in claim 1, wherein a width of the gap is less than or equal to about 3 mm.

6. The high frequency sputtering device as claimed in claim 1, wherein a depth of the gap is greater than or equal to about 3 mm.

7. The high frequency sputtering device as claimed in claim 5, wherein a depth of the gap is greater than or equal to about 3 mm.

8. The high frequency sputtering device as claimed in claim 1, further comprising a dielectric ring between an outer circumferential surface of the cathode and an inner circumferential surface of the processing chamber, wherein:

the second portion of the gap is defined by a space extending axially between the metal shield and the target, the second portion having an axially extending length, and the first portion of the gap is defined by a space extending radially between the dielectric ring and a radial point defined by an inner circumferential surface of the metal shield, the first portion having a radially extending length, wherein the radially extending length is 3 mm or greater.

9. The high frequency sputtering device as claimed in claim 1, wherein the first portion of the gap is defined by a space extending radially between a radial point defined by an outer edge of the cathode and another radial point defined by an inner circumferential surface of the metal shield, the first portion having a radially extending length of 3 mm or greater.

10. The high frequency sputtering device as claimed in claim 1, further comprising a dielectric ring between an outer circumferential surface of the cathode and an inner circumferential surface of the processing chamber, wherein:

the second portion of the gap is defined by a space extending axially between the metal shield and the target, the second portion having an axially extending length, and the first portion of the gap is defined by a space extending radially between the dielectric ring and a radial point defined by an inner circumferential surface of the metal shield, the first portion having a radially extending length, wherein the axially extending length and the radially extending length together is greater than 3 mm.

11. The high frequency sputtering device as claim in claim 1, wherein a width of the gap is less than or equal to 3 mm.

12. The high frequency sputtering device as claimed in claim 1, wherein a depth of the gap is greater than or equal to 3 mm.

13. The high frequency sputtering device as claimed in claim 5, wherein a depth of the gap is greater than or equal to 3 mm.

14. The high frequency sputtering device as claimed in claim 1, wherein:

the second portion of the gap is defined by a space extending axially between the metal shield and the target, the second portion having an axially extending length, and the first portion of the gap is defined by a space extending radially between a first radial point defined by an inner circumferential surface of the metal plate shield and a second radial point defined by an outer circumferential surface of the cathode, the first portion having a radially extending length, wherein the radially extending length is 3 mm or greater.

15. The high frequency sputtering device as claimed in claim 1, wherein:

the second portion of the gap is defined by a space extending axially between the metal shield and the target, the second portion having an axially extending length, and the first portion of the gap is defined by a space extending radially between a first radial point defined by an inner circumferential surface of the metal shield and a second radial point defined by an outer circumferential surface of the cathode, the first portion having a radially extending length, wherein the axially extending length and the radially extending length together is greater than 3 mm.

16. The high frequency sputter device of claim 1, wherein the first portion is defined between substantially horizontal surfaces of the metal shield and the cathode and the second portion is defined between substantially vertical surfaces of the metal shield and the target.

17. The high frequency sputter device of claim 16, wherein an opening of the gap closest to the target is in the second portion.

* * * * *